United States Patent [19]

Shiga

[11] Patent Number: 4,955,684

[45] Date of Patent: Sep. 11, 1990

[54] OPTICAL MODULE COUPLING DEVICE

[75] Inventor: Nobuo Shiga, Yokohama, Japan

[73] Assignee: Sumitomo Electric Industries, Ltd., Osaka, Japan

[21] Appl. No.: 391,050

[22] Filed: Aug. 9, 1989

[30] Foreign Application Priority Data

Aug. 24, 1988 [JP] Japan ................... 63-210119

[51] Int. Cl.$^5$ ................................. G02B 6/42
[52] U.S. Cl. ..................... 350/96.20; 250/227.11; 357/74
[58] Field of Search ............ 350/96.15, 96.16, 96.17, 350/96.18, 96.20, 96.21, 96.22; 250/227; 357/74

[56] References Cited

U.S. PATENT DOCUMENTS 4,727,649  3/1988  Nishizawa ................. 350/96.20 X

FOREIGN PATENT DOCUMENTS 2136983  9/1984  United Kingdom ............ 350/96.20

Primary Examiner—John D. Lee
Attorney, Agent, or Firm—Beveridge, DeGrandi & Weilacher

[57] ABSTRACT

In an optical module with a substrate having an optical unit mounted thereon which substrate is provided on the bottom of a package so that the optical unit is optically coupled with an end of an optical fiber extending into the package, a chip carrier, including the optical unit, is die-bonded to a conductive land formed on the substrate. A recess is formed in the bottom of the package which faces the land. Thus, a capacitance of a parallel-plate capacitor formed by the land and the bottom of the is made negligibly small.

10 Claims, 4 Drawing Sheets

OPTICAL MODULE COUPLING DEVICE

BACKGROUND OF THE INVENTION

1. Field of the invention

The present invention relates to an optical module for use with an optical communication system such as data link or an optical LAN which uses light as an information transmission medium.

2. Related Background Art

In a known optical module, a semiconductor laser or a light emitting diode, which is a light emitting element, or a PIN photo-diode which is a light detecting element, is mounted as an optical unit and is optically coupled with an optical fiber in a package. However, a response frequency band of the known optical module is not sufficiently high.

SUMMARY OF THE INVENTION

It is an object of the present invention to provide an optical module having a sufficiently high response frequency band.

In order to achieve the above object, the present invention provides an optical module with a substrate having an optical unit mounted thereon, which substrate is provided on the bottom of a package so that the optical unit is optically coupled with an end of an optical fiber extending into the package. A chip carrier including the optical unit is die-bonded to a conductive land formed on the substrate and a recess formed in the bottom of the package faces the land.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only since various changes and modifications within the spirit and scope of the invention will become apparent to those skilled in the art from this detailed description.

DETAILED DESCRIPTION OF THE PREFERRED EMBODIMENTS

Figure 1:
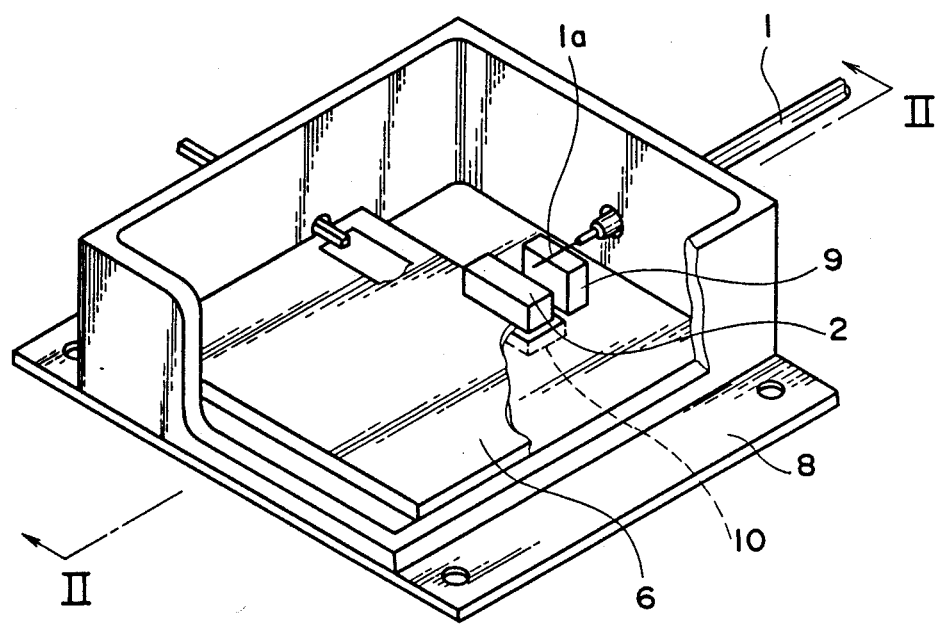
FIG. 1 is a perspective view showing a main part of an optical module in accordance with one embodiment of the present invention.
Figure 2:
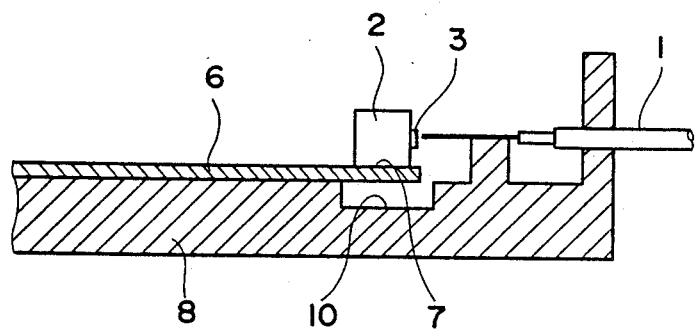
FIG. 2 is a side sectional view taken along line II—II of FIG. 1.

As shown in FIGS. 1 and 2, a hybrid IC substrate 6 made of ceramics is mounted on an inner face of the bottom of a package 8 made of metal. A chip carrier 2 is mounted on the hybrid IC substrate 6.

Figure 3:
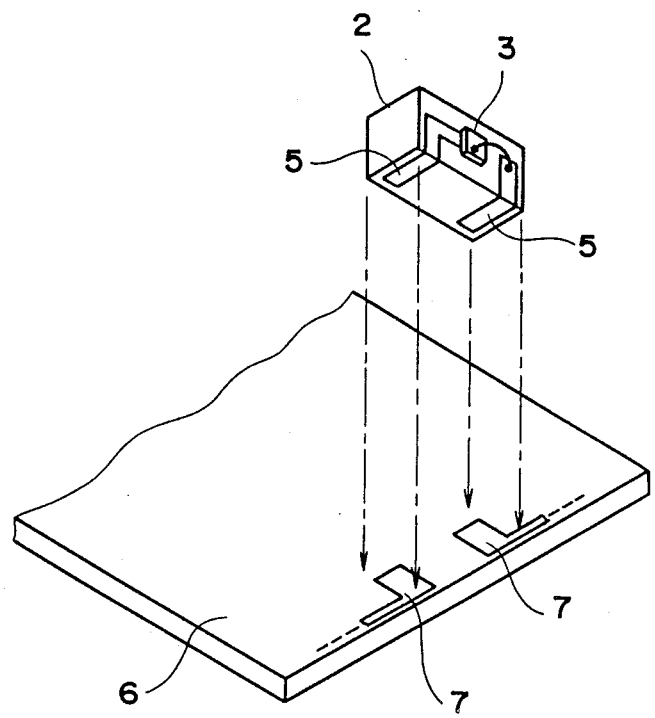
FIG. 3 is a perspective view illustrating a manner of die-bonding a chip carrier 2 to a hybrid IC substrate 6.

As shown in FIG. 3, the chip carrier 2 is of parallel-epiped shape and made of ceramics. A PIN photo-diode 3 is mounted on a front plane of the chip carrier 2. Two terminals 5, which are to be connected to an anode and a cathode of the PIN photo-diode 3 on the chip carrier 2, are formed to extend from the front plane to a bottom plane. Those terminals 5 are formed by metallizing selected surface areas of the chip carrier 2. On the other hand, two conductive lands 7 which serve as electrodes are formed on a surface of the hybrid IC substrate 6. The terminals 5 of the chip carrier 2 are die-bonded to the lands 7. The lands 7 are designed to have wider areas than the terminals 5 assuming possible misalignment in mounting the chip carrier 2. With present technique, the area of the land 7 is in the order of 1mm×2mm at minimum.

The PIN photo-diode 3 mounted on the chip carrier 2 faces a leading end plane of an optical fiber 1 in the package 8. The leading end of the optical fiber 1 is inserted into the package 8 through an opening formed in a side wall of the package 8. A cover of the optical fiber 1 is striped off at the leading end thereof so that a glass fiber is exposed. The exposed area is metal-plated except for the leading end plane. The metal-plated area 1a is positioned on a fixed member 9 mounted on the bottom of the package 8 and fixed thereto by soldering. The metal-plated area 1a of the optical fiber 1 is positioned such that light emitted from the leading end plane of the optical fiber 1 is sufficiently directed to a photo-sensing area of the PIN photo-diode 3. In this manner, the optical fiber 1 and the PIN photo-diode 3 are optically coupled.

A recess 10 is formed in the bottom of the package 8. The recess 10 is formed at a position which faces the lands 7 with the intervention of the hybrid IC substrate 6 when the hybrid IC substrate 6 is mounted in the package 8. Thus, the lands 7 and the bottom of the package 8 are separated from each other by a space. The recess 10 serves to render a capacitance of a parallel-plate capacitor, which is essentially formed by the lands 7 and the bottom of the package 8, negligibly small.

Figure 4:
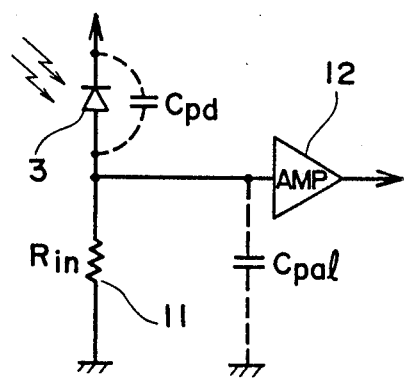
FIG. 4 is a circuit diagram of a light receiver which uses a PIN photo-diode.

The parallel-plate capacitor which is essentially formed by the lands 7 and the bottom of the package 8 is now explained. FIG. 4 shows an embodiment of a light receiver which uses the PIN photo-diode 3. The parallel-plate capacitor formed by the lands 7 and the bottom of the package 8 function as an input capacitance $C_{pal}$ of an amplifier 12. A response frequency band of the light receiver is determined by a time constant T which is determined by a resistance $R_{in}$ of an input resistor 11, a junction capacitance $C_{pd}$ of the PIN photo-diode 3 and the input capacitance $C_{pal}$. As the time constant T increases, the amount of information per unit time decreases. The time constant T is given by $$T = (C_{pd} + C_{pal}) \cdot R_{in}$$

The junction capacitance $C_{pd}$ of the PIN photo-diode 3 used for high speed optical communication is very small, usually on the order of 0.3~0.4 pF. Accordingly, the affect of the input capacitance $C_{pal}$ on the time constant T is very great and it should be as small as possible.

If the recess 10 is not formed, the capacitance $C_{pal}$ of the parallel-plate capacitor is 0.46 pF assuming that the area of the land 7 is 1mm×2mm, a dielectric constant $\epsilon$ of the hybrid IC substrate 6 is 9, and a thickness thereof is 350 μm. It is 0.25 pF assuming that the thickness of the hybrid IC substrate 6 is 650 μm. This capacitance is substantially equal to or larger than the capacitance of $C_{pd}$ (0.3~0.4 pF). It is thus seen that the affect on the time constant T is very great.

In the optical module of the present embodiment, since the recess 10 is formed in the inner bottom of the package 8, the capacitance of the parallel-plate capacitor formed by the lands 7 and the bottom of the package 8 is small enough to permit neglection of the input capacitance $C_{pal}$ of the amplifier 12. As a result, the time constant T of the light receiver is reduced and the response frequency band is increased.

This embodiment is a receiving optical module which uses the PIN photo-diode 3 as the optical unit which is optically coupled to the optical fiber 1. The same problem is encountered in a transmitting optical module which uses a light emitting element such as LED or laser diode as the optical unit, and the present invention is also applicable to such a transmitting optical module.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. An optical module coupling device comprising:
   a metallic package;
   a substrate made of insulative material and provided on the bottom of said package, said substrate having a conductive land on one side thereof and an area in opposition to said land on the opposite side thereof; and
   a chip carrier mounted on said substrate and having an optical unit to be optically coupled with an end of an optical fiber extending into said package, said area of said substrate being spaced from said bottom of said package.

2. An optical module coupling device according to claim 1, wherein said optical unit comprises a photo-detecting element.

3. An optical module coupling device according to claim 1, wherein said optical unit comprises a light emitting device.

4. An optical module coupling device comprising:
   a metallic package;
   a substrate made of insulative material and provided on the bottom of said package, said substrate having a conductive land on one side thereof and an area in opposition to said land on the opposite side thereof; and
   a chip carrier mounted on said substrate and having an optical unit to be optically coupled with an end of an optical fiber extending into said package, said bottom of said package having a recess located in opposition to said area.

5. An optical module coupling device according to claim 4, wherein said optical unit comprises a photo-detecting element.

6. An optical module coupling device according to claim 4, wherein said optical unit comprises a light emitting element.

7. An optical module coupling device comprising:
   a metallic package;
   a substrate provided on the bottom of said package, said substrate having a conductive land thereon; and
   a chip carrier mounted on said substrate and having an optical unit to be optically coupled with an end of an optical fiber extending into said package;
   said substrate being spaced from said bottom of said package at an area opposite to said land, and said device including a parallel plate capacitor formed by said land and said bottom of said package.

8. An optical module coupling device according to claim 7, wherein said substrate is made of insulative material.

9. An optical module coupling device comprising:
   a metallic package;
   a substrate made of insulative material and provided on the bottom of said package, said substrate having a conductive land thereon; and
   a chip carrier mounted on said substrate and having an optical unit to be optically coupled with an end of an optical fiber extending into said package;
   said bottom of said package having a recess at an area which is opposite to said land, and said device including a parallel plate capacitor formed by said land and said bottom of said package.

10. An optical module coupling device according to claim 9, wherein said chip carrier comprises insulative material and conductive terminals formed on said insulative material.

* * * * *